United States Patent
Sheng

(10) Patent No.: US 9,335,382 B2
(45) Date of Patent: May 10, 2016

(54) BATTERY TESTER WITH HIGH PRECISION

(71) Applicant: DHC SPECIALTY CORP., Taipei (TW)

(72) Inventor: Hsien-Fang Sheng, Taipei (TW)

(73) Assignee: DHC SPECIALTY CORP. (TW)

( * ) Notice: Subject to any disclaimer, the term of this patent is extended or adjusted under 35 U.S.C. 154(b) by 2 days.

(21) Appl. No.: 14/594,725

(22) Filed: Jan. 12, 2015

(65) Prior Publication Data

US 2015/0127282 A1     May 7, 2015

Related U.S. Application Data

(63) Continuation-in-part of application No. 13/069,033, filed on Mar. 22, 2011, now abandoned.

(51) Int. Cl.
    *G01R 31/36*          (2006.01)
    *H02J 7/00*           (2006.01)

(52) U.S. Cl.
    CPC .................................. *G01R 31/3631* (2013.01)

(58) Field of Classification Search
    CPC .................................................. G01R 31/3631
    USPC .............. 702/63, 60, 61, 62, 64, 65; 324/430; 320/132
    See application file for complete search history.

(56) References Cited

U.S. PATENT DOCUMENTS

| | | | | |
|---|---|---|---|---|
| 5,140,269 | A * | 8/1992 | Champlin | G01R 19/16542 320/132 |
| 6,144,185 | A * | 11/2000 | Dougherty | G01R 31/3631 320/132 |
| 6,424,158 | B2 * | 7/2002 | Klang | G01R 31/3631 320/156 |
| 7,652,448 | B2 * | 1/2010 | Palladino | H01M 10/48 320/104 |
| 7,723,993 | B2 * | 5/2010 | Klang | G01R 31/3634 320/144 |
| 2007/0090844 | A1 * | 4/2007 | Klang | G01R 31/3648 324/426 |
| 2009/0051364 | A1 * | 2/2009 | Ishida | H02J 7/1461 324/430 |
| 2009/0179763 | A1 * | 7/2009 | Sheng | G01R 31/3627 340/636.1 |
| 2010/0088050 | A1 * | 4/2010 | Keuss | G01R 31/3631 702/63 |

* cited by examiner

*Primary Examiner* — Gregory J Toatley
*Assistant Examiner* — Eman Alkafawi
(74) *Attorney, Agent, or Firm* — Hershkovitz & Associates, PLLC; Abe Hershkovitz

(57) ABSTRACT

The battery tester has a casing having an input device and two detecting wires, a microprocessor, a loading unit and a battery power status detector. The microprocessor builds a strategic decision process therein to determine a discharge time of a battery according to an output current, a preset load having 1/N CCA (Cold Cranking Amps) and a preset loading time inputted from the input device. Therefore, the battery tester can detect the health of batteries with different capacities and provides accurate detecting results.

3 Claims, 5 Drawing Sheets

BATTERY TESTER WITH HIGH PRECISION

CROSS-REFERENCE TO RELATED APPLICATIONS

This application is a continuation-in-part (CIP) application of U.S. application Ser. No. 13/069,033, filed on Mar. 22, 2011, the disclosures of which are incorporated herein in their entirety by reference.

BACKGROUND OF THE INVENTION

1. Field of the Invention

The present invention relates to the field of a battery tester and, more particularly, to a battery tester with high precision.

2. Description of Related Art

There are many types of the rechargeable battery with different capacities in the market. The battery tester is used to detect the residual capacity of the rechargeable battery and determine the health of the rechargeable battery. However, the conventional battery tester uses only one method to detect different rechargeable batteries, and consequently, inaccurate testing result will likely occur.

In general, the conventional battery tester uses ½ cold cranking amps (hereinafter CCA) testing method that utilizes half of the battery capacity to detect the health of the rechargeable battery, the method having steps of: (a) adding a load to the two electrodes of the battery to discharge the battery by loading the amperes of ½CCA for 15 seconds; and (b) determining the health of the battery according to the discharging diagram.

In the conventional testing method implemented by the battery tester, the resistance of the load and the duration of adding load to the battery are fixed. Under the circumstance of fixed load resistance and loading duration, when such battery tester is used to detect rechargeable batteries with different capacities, imprecise testing results from the discharging diagrams inevitably arise. The testing precision of the conventional battery tester is not ideal for all rechargeable batteries.

To overcome the shortcomings, the present invention provides a battery tester with high precision to mitigate or obviate the aforementioned problems.

SUMMARY OF THE INVENTION

Based on the foregoing drawbacks of the conventional battery tester, the main objective of the present invention is to provide a battery tester with high precision.

The battery tester has a casing having an input device and two detecting wires, a microprocessor, a loading unit and a battery power status detector. The microprocessor is built in with a strategic decision process to determine an optimal loading time for a battery according to the battery capacity, a preset load having 1/N of the battery capacity and a preset loading time inputted from the input device. Therefore, the battery tester can tests batteries with different capacities for different loading time and provide accurate testing results.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
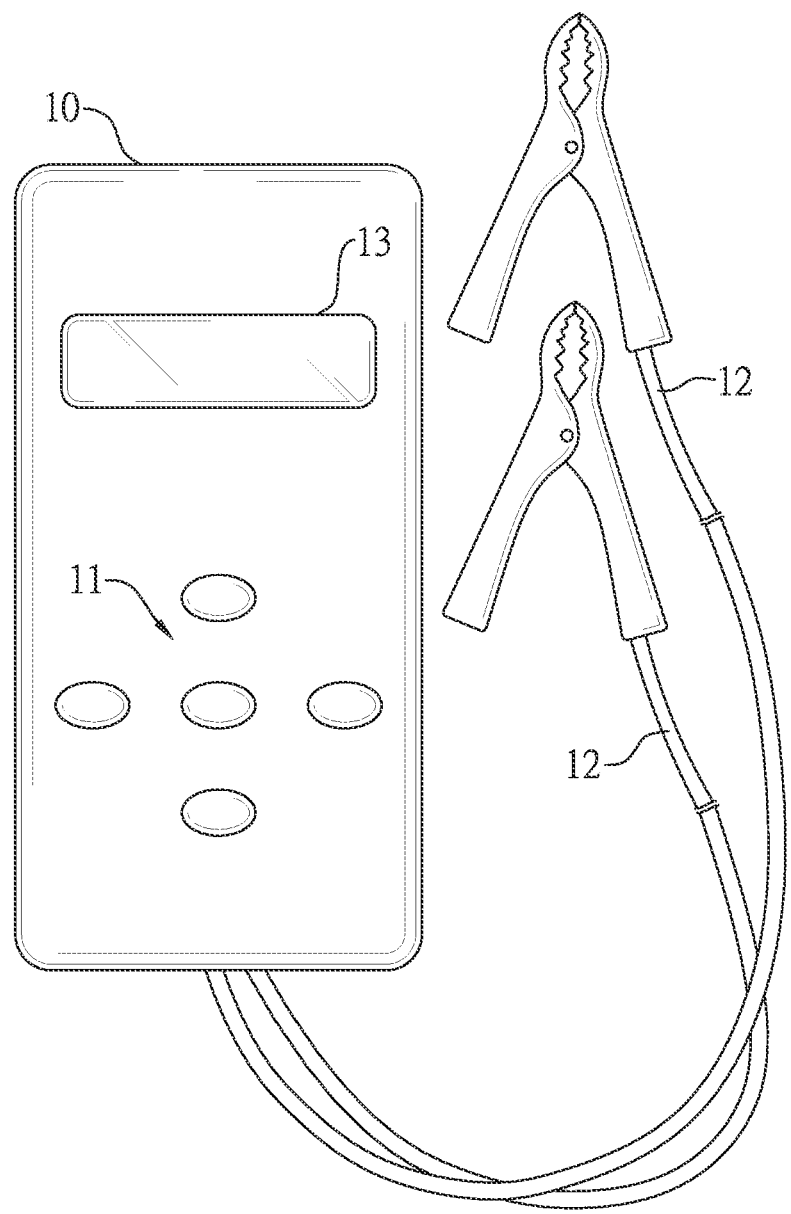
FIG. 1 is a perspective view of a battery tester in accordance with the present invention.
Figure 2:
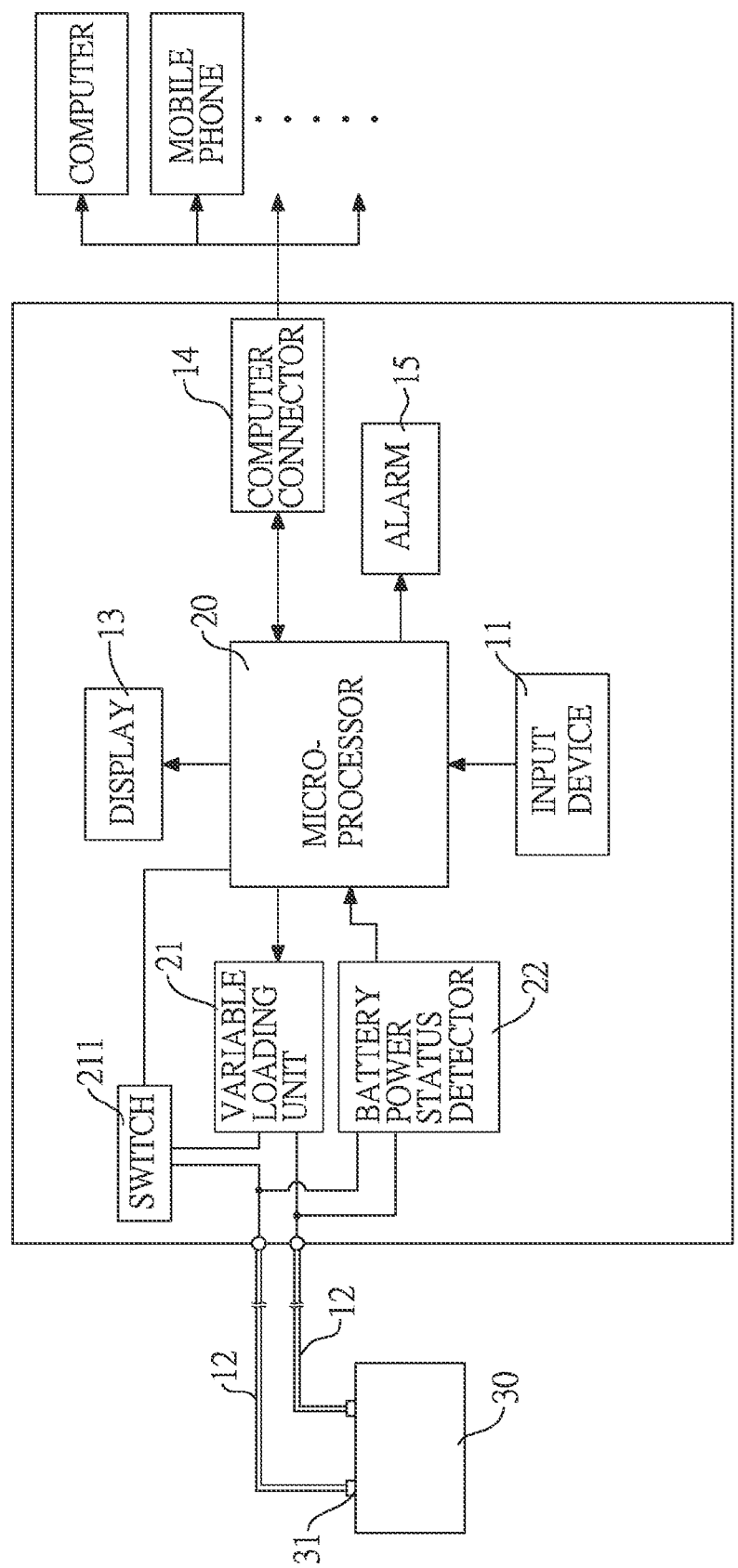
FIG. 2 is a functional block diagram of a battery tester in accordance with the present invention.

With reference to FIGS. 1 and 2, a preferred embodiment of a battery tester with high precision in accordance with the present invention has a casing 10, a microprocessor 20, a loading unit 21, a switch 211 and a battery power status detector 22.

The casing 10 has an input device 11 and two detecting wires 12. The input device 11 allows users to select a specific battery capacity. The detecting wires 12 are respectively and electronically connected to two electrodes 31 of the battery 30. In the preferred embodiment, the two detecting wires 12 are respectively clipped to the two electrodes 31 of the battery 30. The casing 10 further has a display 13, a computer connector 14 and an alarm 15. The computer connector 14 serves for connection between the battery tester and an external electronic device, such as a computer or a mobile phone.

The microprocessor 20 is built in with a strategic decision process and a detecting process therein.

The loading unit 21 is electronically connected to the microprocessor 20 and the two wires 12. The loading unit is further electronically connected to the electrodes 31 of the battery 30 through the two wires 12 to detect voltage and current changes of the battery 30 and then responds with the voltage and current values to the microprocessor 20.

The switch 211 is electronically connected between one of the detecting wires 12 and the loading unit 21 and is controlled by the microprocessor 20.

The battery power status detector 22 is electronically connected between the detecting wires 12 and the microprocessor 20 to detect voltage values and/or current values of the battery. Further, the battery power status detector 22 may be built in the microprocessor 20.

Figure 3:
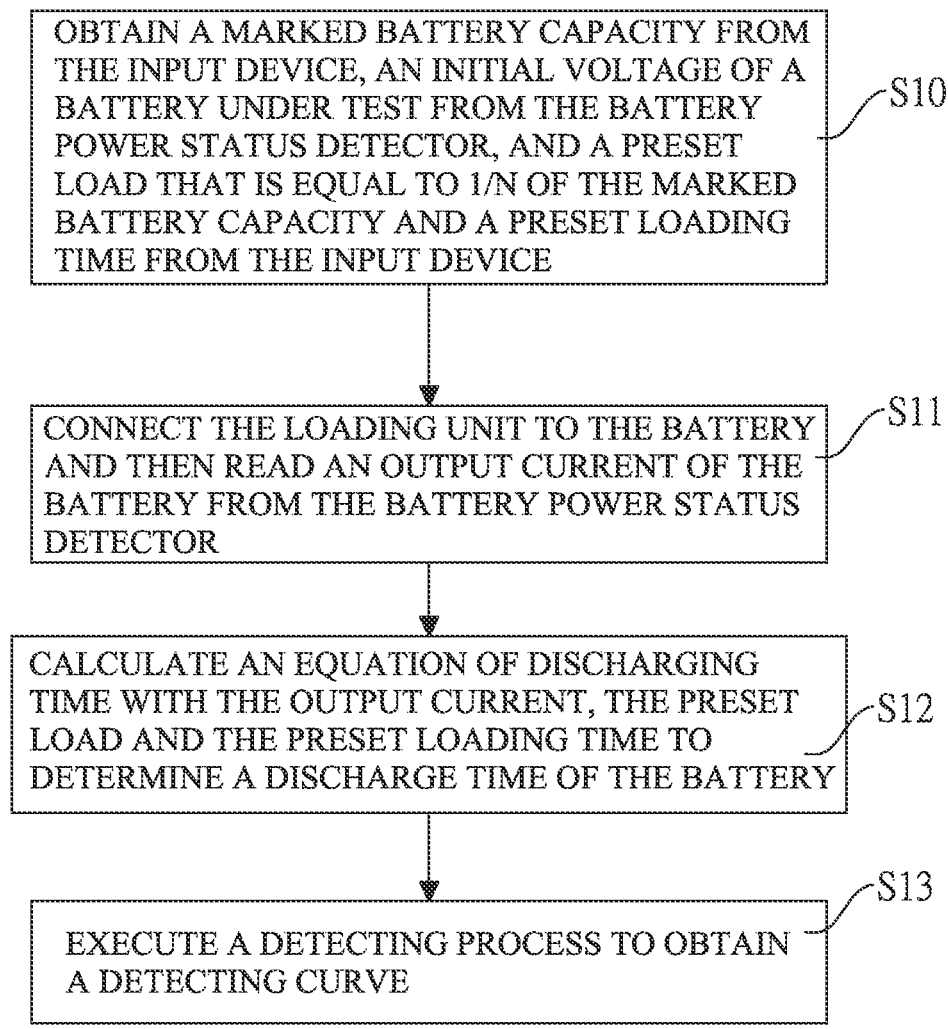
FIG. 3 is a flow chart of a strategic decision process implemented in FIG. 1.

With further reference to FIG. 3, the strategic decision process is performed by the microprocessor 20 and has the following steps of:

Step S10: Obtain a marked battery capacity ($CCA_B$) from the input device 11, a initial voltage ($V_B$) of a battery 30 under test from the battey power status detector 22, and a preset load (1/N $CCA_B$) that is equal to one N-th (1/N) of the marked battery capacity ($CCA_B$) and a preset loading time ($T_{LOAD}$) from the input device 11.

Step S11: Connect the loading unit 21 to the battery 30 and then read an output current ($I_B$) of the battery 30 from the battery power status detector.

Step S12: Calculate an equation of discharging time as follows to determine a discharge time for the battery 30 under test to discharge.

$$T_D = \frac{CCA_B \times \frac{1}{N}}{I_B} \times T_{LOAD}$$

where $T_D$=the discharge time of the battery under test;

$CCA_B$=the marked battery capacity of the battery under tested

N=the number used to divide the marked battery capacity of the battery under test, such that the preset load that is equal to one N-th (1/N) of the battery capacity ($CCA_B$) is obtained;

$I_B$=the output current of the battery under test (equal to the initial voltage ($V_B$)/a fixed resistance of the loading unit 21);

$T_{LOAD}$=the preset loading time applied by the loading unit 21 for all batteries under test.

(d) executing a detecting process to obtain a detecting curve (S13).

Example 1: Given the initial voltage $V_B$ (12 V), the marked battery capacity $CCA_B$ (1000 CCA), the preset load (½$CCA_B$ where N=2), the preset loading time (15 sec), and a fixed resistance (0.12 ohm) of the loading unit 21 upon detection of the health of the battery 30, the microprocessor 20 turns on the switch 211 for the loading unit 21 to be connected to the battery 30, then obtains the output current ($I_B$=100A), and calculates the discharge time of the battery 30 under test in the present example according to the equation of discharging time as follows:

$$\frac{\left(1000 \times \frac{1}{2}\right)}{100} \times 15 = 75 \text{ sec.}$$

Therefore, the discharge time of the battery 30 under test associated with the initial voltage/battery capacity (12V/1000 CCA) is 75 sec.

Example 2: Given the initial voltage $V_B$ (12 V), the marked battery capacity $CCA_B$ (900 CCA), the preset load (⅓$CCA_B$ where N=3), the preset loading time (20 sec), and a fixed resistance (0.08 ohm) of the loading unit 21 upon detection of the health of the battery 30, the microprocessor 20 turns on the switch 211 for the loading unit 21 to be connected to the battery 30, then obtains the output current ($I_B$=150A), and calculates the discharge time of the battery 30 under test in the present example according to the equation of discharging time as follows:

$$\frac{\left(900 \times \frac{1}{3}\right)}{150} \times 20 = 40 \text{ sec.}$$

Therefore, the discharge time of the battery 30 under test associated with the initial voltage/battery capacity (12V/900 CCA) is 40 sec.

Based on the foregoing two examples, although the battery tester uses a variable loading unit, the discharge time of the battery under test is determined according to the marked battery capacity of the battery, the preset load and the preset loading time. In the detecting process, the battery can continuously discharge for the optimal loading time and the microprocessor obtains enough discharging power status in generation of a high precision detecting curve for analysis of the health of the battery according to the detecting curve.

Figure 4:
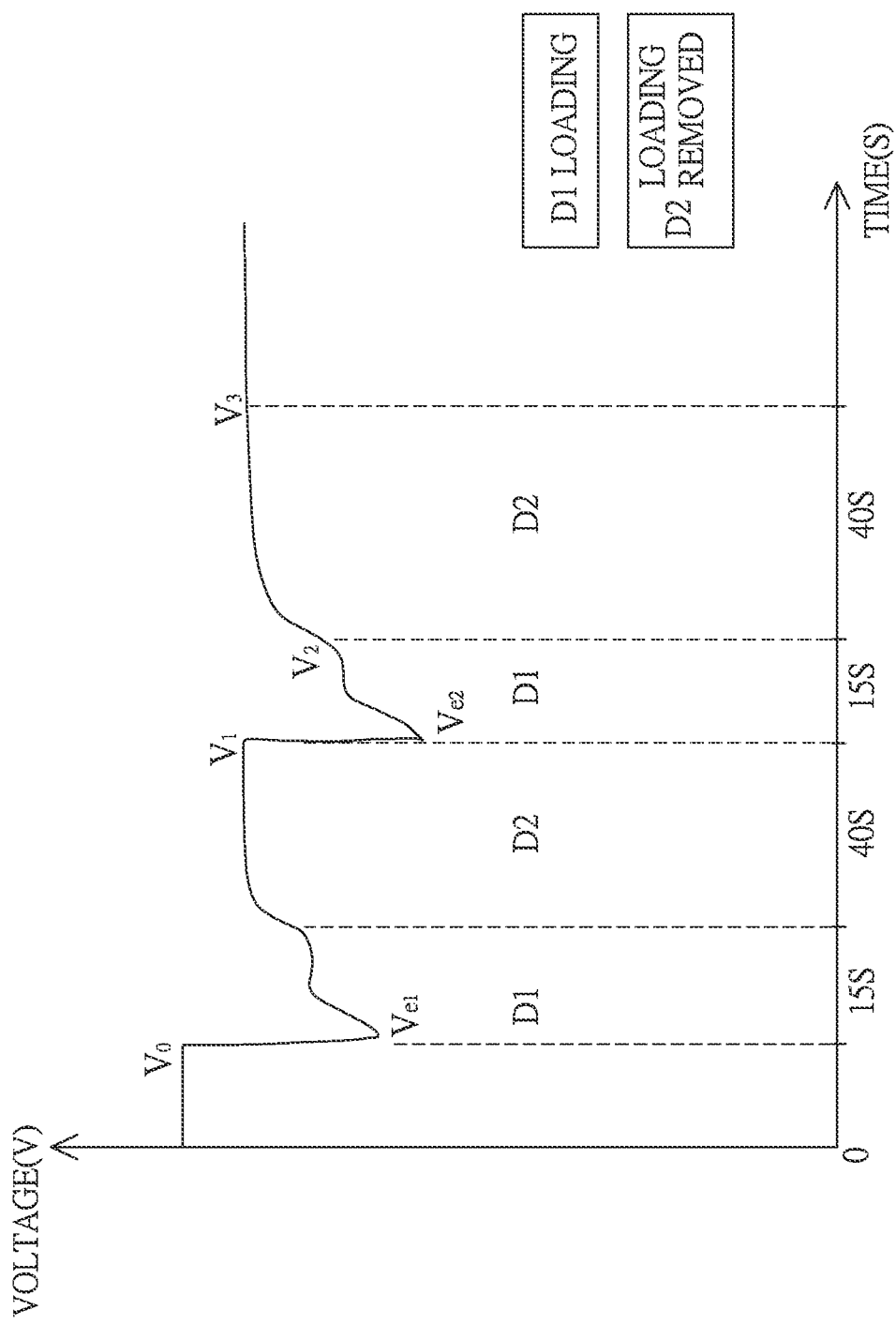
FIG. 4 is a testing diagram of the battery tester in accordance with the present invention.
Figure 5:
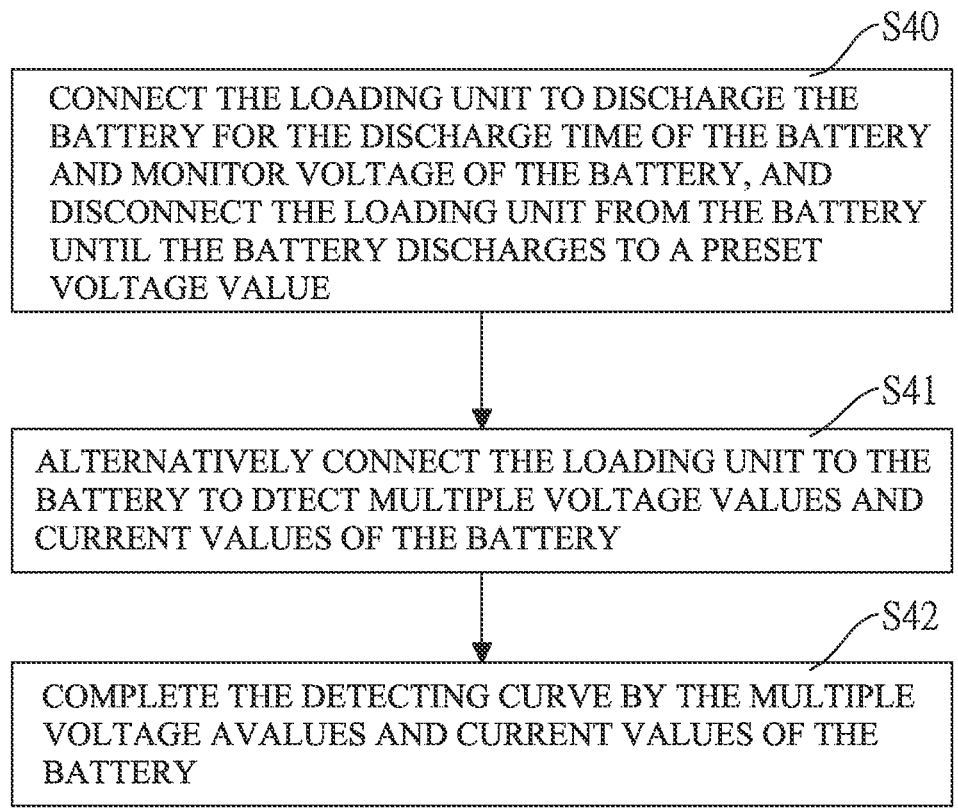
FIG. 5 is a flow chart of a detecting process in accordance with the present invention.

With reference to FIGS. 2, 4 and 5, the detecting curve obtained by the microprocessor 20 and the flow chart of the detecting process are shown. In the detecting process, the loading unit 21 is then connected to the battery 30. The microprocessor 20 continuously detects voltage of the battery 30 under test. The loading unit 21 applies a load to discharge the battery 30 under test for the discharge time of the battery 30 according to the equation of discharging time, the microprocessor 20 then records $V_0$, $V_{e1}$, $V_1$ in FIG. 4, and the loading unit 21 is disconnected from the battery 30 until the battery discharges to a preset voltage value (S40). Unless surface charge is detected from the battery 30 under test, the loading unit 21 only applies the load to discharge the battery 30 under test once. In the case of detection of surface charge, the loading unit 21 is alternatively connected to the battery 30 to detect multiple voltage values and current values of the battery 30. During the second application of the loading unit, the voltage values $V_2$ and $V_3$ are used to calculate the remaining CCA in the battery 30 (S41). Finally, the detecting curve is completed by the voltage values and/or current values and the microprocessor determines the health of the battery according to the detecting curve (S42).

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A battery tester with high precision, comprising:
  a casing having:
    an input device serving to input a marked battery capacity ($CCA_B$), a preset load (1/N $CCA_B$) being 1/N of the marked battery capacity, and a preset loading time ($T_{LOAD}$) of a battery, wherein N is a positive real number; and
    two detecting wires adapted to selectively connect to two electrodes of the battery;
  a microprocessor built in with a strategic decision process;
  a loading unit electronically connected to the microprocessor and connected to the detecting wires;
  a switch electronically connected between one of the detecting wires and the loading unit, and controlled by the microprocessor; and
  a battery power status detector electronically connected to the microprocessor to detect a initial voltage ($V_B$) and an output current ($I_B$) of the battery and reporting the initial voltage and the output current to the microprocessor;
  wherein the strategic decision process is performed by the microprocessor and has steps of:
  (a) obtaining the marked battery capacity, the preset load and the preset loading time from the input device and the initial voltage of the battery from the battery power status detector;
  (b) connecting the loading unit to the battery and then reading the output current of the battery from the battery power status detector;
  (c) calculating an equation of discharging time with the output current, the marked battery capacity, the preset load and the preset loading time to determine a discharge time of the battery, wherein the equation of discharging time is $$T_D = \frac{CCA_B \times \frac{1}{N}}{I_B} \times T_{LOAD}$$

where
$T_D$ represents the discharge time of the battery;
$CCA_B$ represents the marked battery capacity of the battery;

N represents the positive real number used to divide the marked battery capacity of the battery to obtain the preset load that is equal to 1/N of the marked battery capacity ($CCA_B$);

$I_B$ represents the output current of the battery and is equal to the initial voltage ($V_B$) divided by a fixed resistance of the loading unit; and $T_{LOAD}$ represents the preset loading time applied by the loading unit;

(d) executing a detecting process to obtain a detecting curve.

2. The battery tester as claimed in claim 1, wherein the microprocessor is further built in with the detecting process, and the detecting process is performed by the microprocessor and has steps of:

(a) connecting the loading unit to discharge the battery and continuously detecting discharging voltage of the battery;

(b) disconnecting the loading unit from the battery until the discharging voltage reaches a preset voltage;

(c) alternatively connecting the loading unit to the battery to detect multiple voltage values and current values of the battery when surface charge is detected in the battery; and (d) completing the detecting curve by the voltage values and current values.

3. The battery tester as claimed in claim 2, wherein the casing further comprises a display, a computer connector and an alarm.

\* \* \* \* \*